United States Patent
Sabbag

(10) Patent No.: US 8,527,840 B2
(45) Date of Patent: Sep. 3, 2013

(54) SYSTEM AND METHOD FOR RESTORING DAMAGED DATA PROGRAMMED ON A FLASH DEVICE

(75) Inventor: Erez Sabbag, Kiryat Tivon (IL)

(73) Assignee: Densbits Technologies Ltd., Haifa (IL)

( * ) Notice: Subject to any disclaimer, the term of this patent is extended or adjusted under 35 U.S.C. 154(b) by 200 days.

(21) Appl. No.: 13/077,587

(22) Filed: Mar. 31, 2011

(65) Prior Publication Data

US 2011/0246852 A1 Oct. 6, 2011

Related U.S. Application Data

(60) Provisional application No. 61/321,310, filed on Apr. 6, 2010.

(51) Int. Cl.
*G11C 29/00* (2006.01)

(52) U.S. Cl.
USPC .......................... 714/766; 714/752

(58) Field of Classification Search
USPC .................................. 714/752, 766
See application file for complete search history.

(56) References Cited

U.S. PATENT DOCUMENTS

| | | | |
|---|---|---|---|
| 4,463,375 A | 7/1984 | Macovski | |
| 4,584,686 A | 4/1986 | Fritze | |
| 4,589,084 A | 5/1986 | Fling et al. | |
| 4,866,716 A | 9/1989 | Weng | |
| 5,077,737 A | 12/1991 | Leger et al. | |
| 5,297,153 A | 3/1994 | Baggen et al. | |
| 5,657,332 A | 8/1997 | Auclair et al. | |
| 5,729,490 A | 3/1998 | Calligaro et al. | |
| 5,793,774 A | 8/1998 | Usui et al. | |
| 5,926,409 A | 7/1999 | Engh et al. | |
| 5,956,268 A | 9/1999 | Lee | |
| 5,982,659 A | 11/1999 | Irrinki et al. | |
| 6,038,634 A | 3/2000 | Ji et al. | |
| 6,094,465 A | 7/2000 | Stein et al. | |
| 6,119,245 A | 9/2000 | Hiratsuka | |
| 6,182,261 B1 | 1/2001 | Haller et al. | |
| 6,192,497 B1 | 2/2001 | Yang et al. | |
| 6,195,287 B1 | 2/2001 | Hirano | |
| 6,199,188 B1 | 3/2001 | Shen et al. | |
| 6,209,114 B1 | 3/2001 | Wolf et al. | |
| 6,259,627 B1 | 7/2001 | Wong | |
| 6,278,633 B1 | 8/2001 | Wong et al. | |
| 6,279,133 B1 | 8/2001 | Vafai et al. | |
| 6,301,151 B1 | 10/2001 | Engh et al. | |
| 6,370,061 B1 | 4/2002 | Yachareni et al. | |
| 6,374,383 B1 | 4/2002 | Weng | |
| 6,504,891 B1 | 1/2003 | Chevallier | |

(Continued)

OTHER PUBLICATIONS

Search Report of PCT Patent Application WO 2009/118720 A3.

(Continued)

*Primary Examiner* — Sam Rizk
(74) *Attorney, Agent, or Firm* — Dentons US LLP

(57) ABSTRACT

A system and a method for restoring damaged data programmed on a memory, such as a Flash memory, including detecting a failure of a memory controller to successfully decode encoded data using a first decoding algorithm, performing soft sampling of the encoded data to provide soft samples of the encoded data, applying, for example, by a computer coupled to the memory controller, a second decoding algorithm on the soft samples of the encoded data. The second decoding algorithm may have an error correction capability exceeding an error correction capability of the first decoding algorithm.

24 Claims, 3 Drawing Sheets

(56) References Cited

U.S. PATENT DOCUMENTS

| | | |
|---|---|---|
| 6,532,169 B1 | 3/2003 | Mann et al. |
| 6,532,556 B1 | 3/2003 | Wong et al. |
| 6,553,533 B2 | 4/2003 | Demura et al. |
| 6,560,747 B1 | 5/2003 | Weng |
| 6,637,002 B1 | 10/2003 | Weng et al. |
| 6,639,865 B2 | 10/2003 | Kwon |
| 6,674,665 B1 | 1/2004 | Mann et al. |
| 6,704,902 B1 | 3/2004 | Shinbashi et al. |
| 6,751,766 B2 | 6/2004 | Guterman et al. |
| 6,772,274 B1 | 8/2004 | Estakhri |
| 6,781,910 B2 | 8/2004 | Smith |
| 6,792,569 B2 | 9/2004 | Cox et al. |
| 6,873,543 B2 | 3/2005 | Smith et al. |
| 6,891,768 B2 | 5/2005 | Smith et al. |
| 6,914,809 B2 | 7/2005 | Hilton et al. |
| 6,915,477 B2 | 7/2005 | Gollamudi et al. |
| 6,952,365 B2 | 10/2005 | Gonzalez et al. |
| 6,961,890 B2 | 11/2005 | Smith |
| 6,990,012 B2 | 1/2006 | Smith et al. |
| 6,996,004 B1 | 2/2006 | Fastow et al. |
| 6,999,854 B2 | 2/2006 | Roth |
| 7,010,739 B1 | 3/2006 | Feng et al. |
| 7,012,835 B2 | 3/2006 | Gonzalez et al. |
| 7,038,950 B1 | 5/2006 | Hamilton et al. |
| 7,068,539 B2 | 6/2006 | Guterman et al. |
| 7,079,436 B2 | 7/2006 | Perner et al. |
| 7,149,950 B2 | 12/2006 | Spencer et al. |
| 7,177,977 B2 | 2/2007 | Chen et al. |
| 7,191,379 B2 | 3/2007 | Adelmann et al. |
| 7,196,946 B2 | 3/2007 | Chen et al. |
| 7,203,874 B2 | 4/2007 | Roohparvar |
| 7,290,203 B2 | 10/2007 | Emma et al. |
| 7,292,365 B2 | 11/2007 | Knox |
| 7,301,928 B2 | 11/2007 | Nakabayashi et al. |
| 7,441,067 B2 | 10/2008 | Gorobets et al. |
| 7,466,575 B2 | 12/2008 | Shalvi et al. |
| 7,533,328 B2 | 5/2009 | Alrod et al. |
| 7,558,109 B2 | 7/2009 | Brandman et al. |
| 7,593,263 B2 | 9/2009 | Sokolov et al. |
| 7,697,326 B2 | 4/2010 | Sommer et al. |
| 7,706,182 B2 | 4/2010 | Shalvi et al. |
| 7,804,718 B2 | 9/2010 | Kim |
| 7,805,663 B2 | 9/2010 | Brandman et al. |
| 7,805,664 B1 | 9/2010 | Yang et al. |
| 7,844,877 B2 | 11/2010 | Litsyn et al. |
| 7,961,797 B1 | 6/2011 | Yang et al. |
| 8,020,073 B2 | 9/2011 | Emma et al. |
| 8,099,652 B1 * | 1/2012 | Alrod et al. ................... 714/773 |
| 8,122,328 B2 | 2/2012 | Liu et al. |
| 2002/0063774 A1 | 5/2002 | Hillis et al. |
| 2002/0085419 A1 | 7/2002 | Kwon et al. |
| 2002/0154769 A1 | 10/2002 | Petersen et al. |
| 2003/0065876 A1 | 4/2003 | Lasser |
| 2003/0101404 A1 | 5/2003 | Zhao et al. |
| 2003/0105620 A1 | 6/2003 | Bowen |
| 2003/0192007 A1 | 10/2003 | Miller et al. |
| 2004/0015771 A1 | 1/2004 | Lasser et al. |
| 2004/0030971 A1 | 2/2004 | Tanaka et al. |
| 2004/0153722 A1 | 8/2004 | Lee |
| 2004/0153817 A1 | 8/2004 | Norman et al. |
| 2004/0181735 A1 | 9/2004 | Xin |
| 2005/0013165 A1 | 1/2005 | Ban |
| 2005/0018482 A1 | 1/2005 | Cemea et al. |
| 2005/0083735 A1 | 4/2005 | Chen et al. |
| 2005/0117401 A1 | 6/2005 | Chen et al. |
| 2005/0120265 A1 | 6/2005 | Pline et al. |
| 2005/0128811 A1 | 6/2005 | Kato et al. |
| 2005/0138533 A1 | 6/2005 | Le-Bars et al. |
| 2005/0144213 A1 | 6/2005 | Simkins et al. |
| 2005/0144368 A1 | 6/2005 | Chung et al. |
| 2005/0169057 A1 | 8/2005 | Shibata et al. |
| 2005/0172179 A1 | 8/2005 | Brandenberger et al. |
| 2005/0213393 A1 | 9/2005 | Lasser |
| 2006/0059406 A1 | 3/2006 | Micheloni et al. |
| 2006/0059409 A1 | 3/2006 | Lee |
| 2006/0064537 A1 | 3/2006 | Oshima et al. |
| 2006/0101193 A1 | 5/2006 | Murin |
| 2006/0203587 A1 | 9/2006 | Li et al. |
| 2006/0221692 A1 | 10/2006 | Chen |
| 2006/0248434 A1 | 11/2006 | Radke et al. |
| 2006/0268608 A1 | 11/2006 | Noguchi et al. |
| 2006/0294312 A1 | 12/2006 | Walmsley |
| 2007/0025157 A1 | 2/2007 | Wan et al. |
| 2007/0063180 A1 | 3/2007 | Asano et al. |
| 2007/0103992 A1 | 5/2007 | Sakui et al. |
| 2007/0104004 A1 | 5/2007 | So et al. |
| 2007/0109858 A1 | 5/2007 | Conley et al. |
| 2007/0124652 A1 | 5/2007 | Litsyn et al. |
| 2007/0143561 A1 | 6/2007 | Gorobets |
| 2007/0150694 A1 | 6/2007 | Chang et al. |
| 2007/0168625 A1 | 7/2007 | Cornwell et al. |
| 2007/0171714 A1 | 7/2007 | Wu et al. |
| 2007/0171730 A1 | 7/2007 | Ramamoorthy et al. |
| 2007/0180346 A1 | 8/2007 | Murin |
| 2007/0223277 A1 | 9/2007 | Tanaka et al. |
| 2007/0226582 A1 | 9/2007 | Tang et al. |
| 2007/0226592 A1 | 9/2007 | Radke |
| 2007/0228449 A1 | 10/2007 | Takano et al. |
| 2007/0253249 A1 | 11/2007 | Kang et al. |
| 2007/0253250 A1 | 11/2007 | Shibata et al. |
| 2007/0263439 A1 | 11/2007 | Cornwell et al. |
| 2007/0266291 A1 | 11/2007 | Toda et al. |
| 2007/0271494 A1 | 11/2007 | Gorobets |
| 2008/0010581 A1 | 1/2008 | Alrod et al. |
| 2008/0028014 A1 | 1/2008 | Hilt et al. |
| 2008/0055989 A1 | 3/2008 | Lee et al. |
| 2008/0082897 A1 | 4/2008 | Brandman et al. |
| 2008/0092026 A1 | 4/2008 | Brandman et al. |
| 2008/0104309 A1 | 5/2008 | Cheon et al. |
| 2008/0109703 A1 * | 5/2008 | Brandman ................... 714/763 |
| 2008/0116509 A1 | 5/2008 | Harari et al. |
| 2008/0126686 A1 | 5/2008 | Sokolov et al. |
| 2008/0127104 A1 | 5/2008 | Li et al. |
| 2008/0128790 A1 | 6/2008 | Jung |
| 2008/0130341 A1 | 6/2008 | Shalvi et al. |
| 2008/0137413 A1 | 6/2008 | Kong et al. |
| 2008/0148115 A1 | 6/2008 | Sokolov et al. |
| 2008/0158958 A1 | 7/2008 | Shalvi et al. |
| 2008/0159059 A1 | 7/2008 | Moyer |
| 2008/0162079 A1 | 7/2008 | Astigarraga et al. |
| 2008/0168216 A1 | 7/2008 | Lee |
| 2008/0168320 A1 | 7/2008 | Cassuto et al. |
| 2008/0181001 A1 | 7/2008 | Shalvi |
| 2008/0198650 A1 | 8/2008 | Shalvi et al. |
| 2008/0198652 A1 | 8/2008 | Shalvi et al. |
| 2008/0219050 A1 | 9/2008 | Shalvi et al. |
| 2008/0225599 A1 | 9/2008 | Chae |
| 2008/0263262 A1 | 10/2008 | Sokolov et al. |
| 2008/0282106 A1 | 11/2008 | Shalvi et al. |
| 2008/0285351 A1 | 11/2008 | Shlick et al. |
| 2008/0301532 A1 | 12/2008 | Uchikawa et al. |
| 2009/0024905 A1 | 1/2009 | Shalvi et al. |
| 2009/0043951 A1 | 2/2009 | Shalvi et al. |
| 2009/0072303 A9 | 3/2009 | Prall et al. |
| 2009/0091979 A1 | 4/2009 | Shalvi |
| 2009/0103358 A1 | 4/2009 | Sommer et al. |
| 2009/0106485 A1 | 4/2009 | Anholt |
| 2009/0113275 A1 | 4/2009 | Chen et al. |
| 2009/0125671 A1 | 5/2009 | Flynn et al. |
| 2009/0144600 A1 | 6/2009 | Perlmutter et al. |
| 2009/0150748 A1 | 6/2009 | Egner et al. |
| 2009/0157964 A1 | 6/2009 | Kasorla et al. |
| 2009/0158126 A1 | 6/2009 | Perlmutter et al. |
| 2009/0168524 A1 | 7/2009 | Golov et al. |
| 2009/0187803 A1 | 7/2009 | Anholt et al. |
| 2009/0199074 A1 | 8/2009 | Sommer |
| 2009/0213653 A1 | 8/2009 | Perlmutter et al. |
| 2009/0213654 A1 | 8/2009 | Perlmutter et al. |
| 2009/0228761 A1 | 9/2009 | Perlmutter et al. |
| 2009/0240872 A1 | 9/2009 | Perlmutter et al. |
| 2009/0319859 A1 * | 12/2009 | Alrod et al. ................... 714/752 |
| 2010/0005270 A1 | 1/2010 | Jiang |
| 2010/0058146 A1 | 3/2010 | Weingarten et al. |
| 2010/0064096 A1 | 3/2010 | Weingarten et al. |

| | | |
|---|---|---|
| 2010/0088557 A1 | 4/2010 | Weingarten et al. |
| 2010/0091535 A1 | 4/2010 | Sommer et al. |
| 2010/0095186 A1 | 4/2010 | Weingarten |
| 2010/0110787 A1 | 5/2010 | Shalvi et al. |
| 2010/0115376 A1 | 5/2010 | Shalvi et al. |
| 2010/0122113 A1 | 5/2010 | Weingarten et al. |
| 2010/0124088 A1 | 5/2010 | Shalvi et al. |
| 2010/0131580 A1 | 5/2010 | Kanter et al. |
| 2010/0131697 A1* | 5/2010 | Alrod et al. ............... 711/103 |
| 2010/0131806 A1 | 5/2010 | Weingarten et al. |
| 2010/0131809 A1 | 5/2010 | Katz |
| 2010/0131826 A1 | 5/2010 | Shalvi et al. |
| 2010/0131827 A1 | 5/2010 | Sokolov et al. |
| 2010/0131831 A1 | 5/2010 | Weingarten et al. |
| 2010/0146191 A1 | 6/2010 | Katz |
| 2010/0146192 A1 | 6/2010 | Weingarten et al. |
| 2010/0149881 A1 | 6/2010 | Lee et al. |
| 2010/0180073 A1 | 7/2010 | Weingarten et al. |
| 2010/0199149 A1 | 8/2010 | Weingarten et al. |
| 2010/0211724 A1 | 8/2010 | Weingarten |
| 2010/0211833 A1 | 8/2010 | Weingarten |
| 2010/0211856 A1 | 8/2010 | Weingarten |
| 2010/0251066 A1 | 9/2010 | Radke |
| 2010/0253555 A1 | 10/2010 | Weingarten et al. |
| 2010/0257309 A1 | 10/2010 | Barsky et al. |
| 2010/0293321 A1 | 11/2010 | Weingarten |
| 2011/0051521 A1 | 3/2011 | Levy et al. |
| 2011/0055461 A1 | 3/2011 | Steiner et al. |
| 2011/0096612 A1 | 4/2011 | Steiner et al. |
| 2011/0119562 A1 | 5/2011 | Steiner et al. |
| 2011/0153919 A1 | 6/2011 | Sabbag |
| 2011/0161775 A1 | 6/2011 | Weingarten |
| 2011/0214029 A1 | 9/2011 | Steiner et al. |
| 2011/0214039 A1 | 9/2011 | Steiner et al. |
| 2011/0246792 A1 | 10/2011 | Weingarten |
| 2011/0246852 A1 | 10/2011 | Sabbag |
| 2011/0252187 A1 | 10/2011 | Segal et al. |
| 2011/0252188 A1 | 10/2011 | Weingarten |
| 2011/0271043 A1 | 11/2011 | Segal et al. |
| 2011/0274981 A1* | 11/2011 | Yamada et al. ............... 429/303 |
| 2011/0302428 A1 | 12/2011 | Weingarten |
| 2012/0001778 A1 | 1/2012 | Steiner et al. |
| 2012/0005554 A1 | 1/2012 | Steiner et al. |
| 2012/0005558 A1 | 1/2012 | Steiner et al. |
| 2012/0005560 A1 | 1/2012 | Steiner et al. |
| 2012/0008401 A1 | 1/2012 | Katz et al. |
| 2012/0008414 A1 | 1/2012 | Katz et al. |
| 2012/0051144 A1 | 3/2012 | Weingarten et al. |
| 2012/0063227 A1 | 3/2012 | Weingarten et al. |
| 2012/0066441 A1 | 3/2012 | Weingarten |
| 2012/0110250 A1 | 5/2012 | Sabbag et al. |

OTHER PUBLICATIONS

Search Report of PCT Patent Application WO 2009/095902 A3.
Search Report of PCT Patent Application WO 2009/078006 A3.
Search Report of PCT Patent Application WO 2009/074979 A3.
Search Report of PCT Patent Application WO 2009/074978 A3.
Search Report of PCT Patent Application WO 2009/072105 A3.
Search Report of PCT Patent Application WO 2009/072104 A3.
Search Report of PCT Patent Application WO 2009/072103 A3.
Search Report of PCT Patent Application WO 2009/072102 A3.
Search Report of PCT Patent Application WO 2009/072101 A3.
Search Report of PCT Patent Application WO 2009/072100 A3.
Search Report of PCT Patent Application WO 2009/053963 A3.
Search Report of PCT Patent Application WO 2009/053962 A3.
Search Report of PCT Patent Application WO 2009/053961 A3.
Search Report of PCT Patent Application WO 2009/037697 A3.
Yani Chen, Keshab K. Parhi, "Small Area Parallel Chien Search Architectures for Long BCH Codes", Ieee Transactions on Very Large Scale Integration(VLSI) Systems, vol. 12, No. 5, May 2004.
Yuejian Wu, "Low Power Decoding of BCH Codes", Nortel Networks, Ottawa, Ont., Canada, in Circuits and systems, 2004. ISCAS '04. Proceeding of the 2004 International Symposium on Circuits and Systems, published May 23-26, 2004, vol. 2, pp. II-369-II-372 vol. 2.
Michael Purser, "Introduction to Error Correcting Codes", Artech House Inc., 1995.
Ron M. Roth, "Introduction to Coding Theory", Cambridge University Press, 2006.
Akash Kumar, Sergei Sawitzki, "High-Throughput and Low Power Architectures for Reed Solomon Decoder", (a.kumar at tue.nl, Eindhoven University of Technology and sergei.sawitzki at philips.com).
Todd K.Moon, "Error Correction Coding Mathematical Methods and Algorithms", A John Wiley & Sons, Inc., 2005.
Richard E. Blahut, "Algebraic Codes for Data Transmission", Cambridge University Press, 2003.
David Esseni, Bruno Ricco, "Trading-Off Programming Speed and Current Absorption in Flash Memories with the Ramped-Gate Programming Technique", Ieee Transactions on Electron Devices, vol. 47, No. 4, Apr. 2000.
Giovanni Campardo, Rino Micheloni, David Novosel, "VLSI-Design of Non-Volatile Memories", Springer Berlin Heidelberg New York, 2005.
John G. Proakis, "Digital Communications", 3rd ed., New York: McGraw-Hill, 1995.
J.M. Portal, H. Aziza, D. Nee, "EEPROM Memory: Threshold Voltage Built in Self Diagnosis", ITC International Test Conference, Paper 2.1.
J.M. Portal, H. Aziza, D. Nee, "EEPROM Diagnosis Based on Threshold Voltage Embedded Measurement", Journal of Electronic Testing: Theory and Applications 21, 33-42, 2005.
G. Tao, A. Scarpa, J. Dijkstra, W. Stidl, F. Kuper, "Data retention prediction for modern floating gate non-volatile memories", Microelectronics Reliability 40 (2000), 1561-1566.
T. Hirncno, N. Matsukawa, H. Hazama, K. Sakui, M. Oshikiri, K. Masuda, K. Kanda, Y. Itoh, J. Miyamoto, "A New Technique for Measuring Threshold Voltage Distribution in Flash EEPROM Devices", Proc. IEEE 1995 Int. Conference on Microelectronics Test Structures, vol. 8, Mar. 1995.
Boaz Eitan, Guy Cohen, Assaf Shappir, Eli Lusky, Amichai Givant, Meir Janai, Ilan Bloom, Yan Polansky, Oleg Dadashev, Avi Lavan, Ran Sahar, Eduardo Maayan, "4-bit per Cell NROM Reliability", Appears on the website of Saifun.com
Paulo Cappelletti, Clara Golla, Piero Olivo, Enrico Zanoni, "Flash Memories", Kluwer Academic Publishers, 1999.
JEDEC Standard, "Stress-Test-Driven Qualification of Integrated Circuits", JEDEC Solid State Technology Association. JEDEC Standard No. 47F pp. 1-26.
Dempster, et al., "Maximum Likelihood from Incomplete Data via the EM Algorithm", Journal of the Royal Statistical Society. Series B (Methodological), vol. 39, No. 1 (1997), pp. 1-38.
Mielke, et al., " Flash EEPROM Threshold Instabilities due to Charge Trapping During Program/Erase Cycling", IEEE Transactions on Device and Materials Reliability, vol. 4, No. 3, Sep. 2004, pp. 335-344.
Daneshbeh, "Bit Serial Systolic Architectures for Multiplicative Inversion and Division over GF (2)", A thesis presented to the University of Waterloo, Ontario, Canada, 2005, pp. 1-118.
Chen, Formulas for the solutions of Quadratic Equations over GF (2), IEEE Trans. Inform. Theory, vol. IT-28, No. 5, Sep. 1982, pp. 792-794.
Berlekamp et al., "On the Solution of Algebraic Equations over Finite Fields", Inform. Cont. 10, Oct. 1967, pp. 553-564.

* cited by examiner

SYSTEM AND METHOD FOR RESTORING DAMAGED DATA PROGRAMMED ON A FLASH DEVICE

CROSS REFERENCE TO RELATED APPLICATIONS

This application claims the benefit of U.S. Provisional Patent Application Ser. No. 61/321,310, filed on Apr. 6, 2010, which is incorporated in its entirety by reference herein.

FIELD OF THE INVENTION

The present invention relates generally to systems and methods of retrieving data from a Flash memory, and in particular, to systems and methods of retrieving damaged data from a Flash memory.

BACKGROUND OF THE INVENTION

A storage device such as a flash memory module stores encoded data. The encoded data is expected to be decoded by a memory controller. The memory controller is expected to successfully decode the encoded data during the lifespan of the flash memory module. A failure of the memory controller to decode encoded data, for example, when the amount of errors in a memory are beyond the ability of the controller to correct, renders the encoded data invalid, and the controller responds to a retrieval request with an error message. Such a failure may occur, for example, when the flash memory is exposed to high temperatures, or for other reasons.

Memory controllers are expected to be relatively cheap and are required to read and decode encoded information in real time. Accordingly, these requirements may impose a low sampling rate of the encoded data and a use of a decoding scheme that has limited error correction capabilities. Typically, memory controllers use "hard" decoding techniques, i.e., provide a definite determination of the data stored on each cell. However, such techniques may be insufficient to retrieve damaged data.

SUMMARY OF THE INVENTION

According to embodiments of the invention, a system and method are provided for restoring damaged data programmed on a memory. A system may include a memory controller associated with a memory, the memory controller adapted to perform a first decoding algorithm having a first error correction capability on a portion of encoded data stored on the memory, wherein in the event of a failure of the first decoding algorithm to decode the portion of encoded data, the memory controller is adapted to send a failure notification. The system may further include a recovery module associated with a processor, said recovery module being adapted to receive the failure notification, send a request for soft sampling of the portion of encoded data stored on the memory. The memory controller may be further adapted to receive the request for soft sampling of the portion of encoded data stored on the memory, perform the soft sampling of the portion of encoded data accordingly, and send the results of the soft sampling to the recovery module. The recovery module may be adapted to receive the results of the soft sampling and perform thereon a second decoding algorithm having a second error correction capability, wherein the second error correction capability exceeds the first error correction capability.

A method for restoring damaged data programmed on a memory according to embodiments of the invention may include receiving an indication from a memory controller associated with a memory that a first decoding algorithm having a first error correction capability has failed to decode a portion of encoded data stored on the memory, sending a request for soft sampling of the portion of encoded data stored on the memory, receiving the results of the soft sampling from the memory controller, and performing on the results of the soft sampling a second decoding algorithm having a second error correction capability, wherein the second error correction capability exceeds the first error correction capability.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
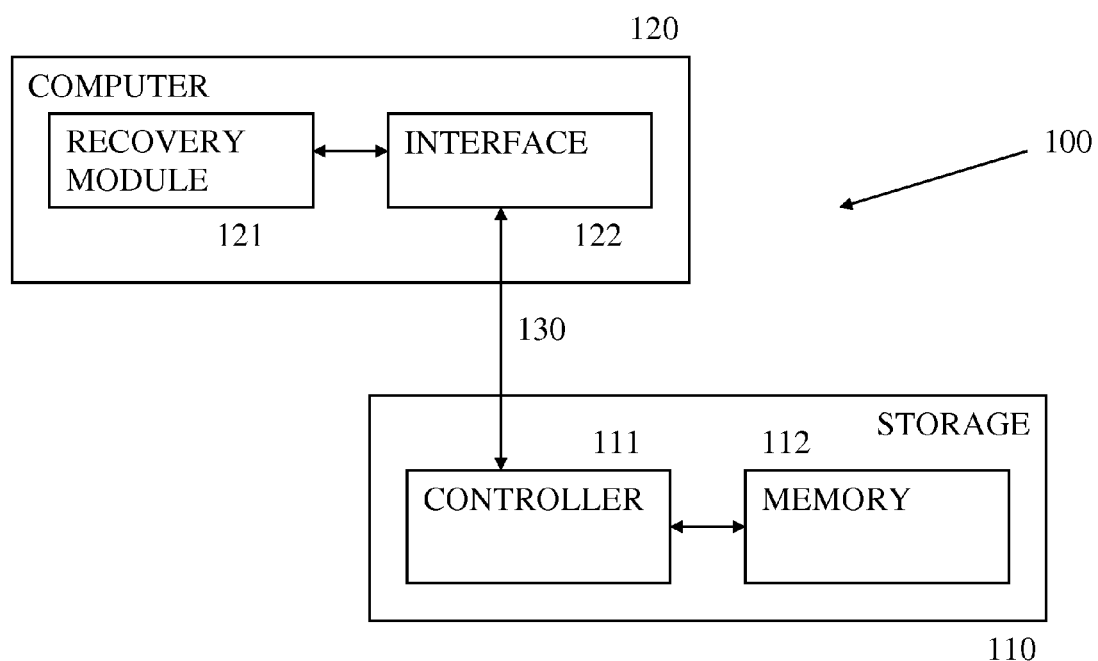
FIG. 1 schematically illustrates a system according to an embodiment of the invention.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF EMBODIMENTS OF THE INVENTION

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Embodiments of the invention may be applicable to various types of memory, including, for example, Secure Digital (SD) cards, solid-state drive (SSD) devices, as well as to other storage devices as hard-drives, optical media, magnetic tapes, etc.

FIG. 1 schematically illustrates system 100 according to an embodiment of the invention.

System 100 includes a storage device 110 (such as but not limited to an SD card) that includes a memory controller 111 and memory 112 and a computer 120. Memory 112 can be a flash memory module or other non-volatile memory module, and may include multiple memory blocks, each including multiple memory pages. Different memory pages may share physical memory rows.

Computer 120 may be connected to storage device 20 (and more specifically, to memory controller 111) through a wired or wireless link, over a network, or any other communication link. Computer 120 can be a remote server, a desktop computer, a laptop computer, a personal digital assistant (PDA), a tablet computer, and the like.

Although in the illustrated embodiment, computer 120 is depicted as being connected to the memory controller 111 via a wired link 130, it will be understood that computer 120 can be connected to memory controller 111 via one or more wireless links, or a combination of wired and wireless links. Computer 120 can be communicatively connected to memory controller 111 directly, or via a network, etc.

In some embodiments of the invention, memory controller 111 may be a small and inexpensive processor, and may have limited computing power, and therefore, limited decoding abilities. According to a mode of operation of embodiments of the invention, memory controller 111 may attempt to retrieve encoded data stored on memory 112, for example, a codeword, a portion of a codeword, or more than a single codeword. Memory controller 111 may first apply a first decoding algorithm that has a certain error correction capability, for example, a hard decoding algorithm. If memory controller 111 fails to successfully decode data stored on memory 112, it may determine that the data is damaged and enter a damaged data restoration mode.

In some embodiments of the invention, a data decoding failure event may be detected by the memory controller 111. For example, memory controller 111 may determines that it failed to successfully decode the encoded data if, for example, it detects that a number of errors in the encoded data exceeds the number of errors that can be amended by the memory controller 111. It will be understood that in some embodiments, the failure to decode encoded data may be detected by an application or a process that uses the decoded data, for example, an application or process executed by or on computer 120. For example, a decoding failure event may be detected by the application or process if the content of the decoded data differs from an expected content.

An indication of failure to successfully decode data encoded and stored on memory 112 may be generated, for example, by memory controller 111. A failure event indication may be sent to computer 120 which may respond by initiating a data restoration or recovery process.

Computer 120 may include interface 122, and a recovery module 121. It will be recognized that according to embodiments of the invention, the recovery module differs from the memory controller, for example, it may be part of a computer having more processing power than the memory controller. The recovery module 121 may include hardware, software and a combination thereof. Recovery module 121 may instruct memory controller 111 to operate in a data restoration mode. In this mode, the memory controller 111 may sample or retrieve the raw or ("hard") encoded data (e.g., voltage levels, etc.), and provide a representation of the encoded data in soft format to computer 120.

In some embodiments of the invention, the memory controller 111 may first provide certain physical memory information to controller 120. For example, the physical memory information may include one or all of: an identity of a page storing the encoded data, an identity of the memory block storing the encoded data, an identity of a die storing the encoded data, a cycle count of the memory block storing the encoded data, an indication about an existence of an old version of the encoded data on storage device 112, one or more coding parameters of the encoded data, scrambling information of the encoded data, and the like.

Computer 120 may instruct the memory controller 111 to sample and retrieve the encoded data stored in storage device 112. The sampling may involve obtaining the encoded data at a fine resolution using, for example, majority sampling. Thus, for a given voltage threshold value, the memory controller 111 can sample the encoded data multiple (k) times to provide multiple sets of k samples and then process each set of k samples to provide a soft sample. For example, the memory controller 111 can process each set of k samples by selecting a median value of the set. In some embodiments of the invention, computer 120 may determine the sampling resolution to be used and communicate the sampling parameters to memory controller 111. This determination may be responsive to the encoded data physical information provided by memory controller 111.

Upon obtaining and/or processing the soft samples, memory controller 111 may send the soft samples to computer 120, for example, by way of interface 122. Computer 120 may decode the soft samples of the encoded data, for example, by applying a second decoding algorithm having a higher or better error correction capability than the error correction capability of the first decoding algorithm applied by the memory controller 111. In some embodiments of the invention, the second decoding algorithm may be a soft decoding algorithm. For example, the soft decoding algorithm applied as the second decoding algorithm may be a soft version of the first decoding algorithm, or it may be another soft decoding algorithm. In some embodiments of the invention, the second decoding algorithm may be a hard decoding algorithm having better error correction capability than the first decoding algorithm.

According to some embodiments of the invention, the determination of the parameters of the second decoding algorithm may be responsive to one or more of the following: (i) threshold values shift along a memory block that stores the encoded data; (ii) decoded bits stored in another memory page of the storage device, wherein the other memory page and the memory page that stores the encoded data share memory rows; this can include decoded bits that belong to another logical layer such as most significant bit, least significant bit and CSB; (iii) soft samples obtained while supplying different bias voltage to the memory page that stores the encoded data; and (iv) an old version of the encoded data that may be stored in another memory page.

According to some embodiments, second decoding algorithm may be very involved or time-consuming Accordingly, computer 120 may apply the second decoding algorithm over long periods of time (in comparison to the decoding period of the memory controller 111) and by using stronger computational resources. Increased decoding time and/or computational resources may increase the probability of successful decoding using the second decoding algorithm by computer 120. According to some embodiments of the invention, by applying the second decoding algorithm, the reliability of the storage device may increase by an order of magnitude. For example, the raw Bit Error Rate can be increased by tenfold (i.e., the SNR gain may be 1-3 dB). See, e.g., R. Kotter and A. Vardy, "Algebraic soft decision decoding of Reed-Solomon codes", *IEEE Trans. Inform. Theory*, vol 49, No. 11, pp.

2809-2825, November 2003 (demonstrating performance differences between hard and soft decoding using Kotter-Vardy algorithm).

Figure 2:
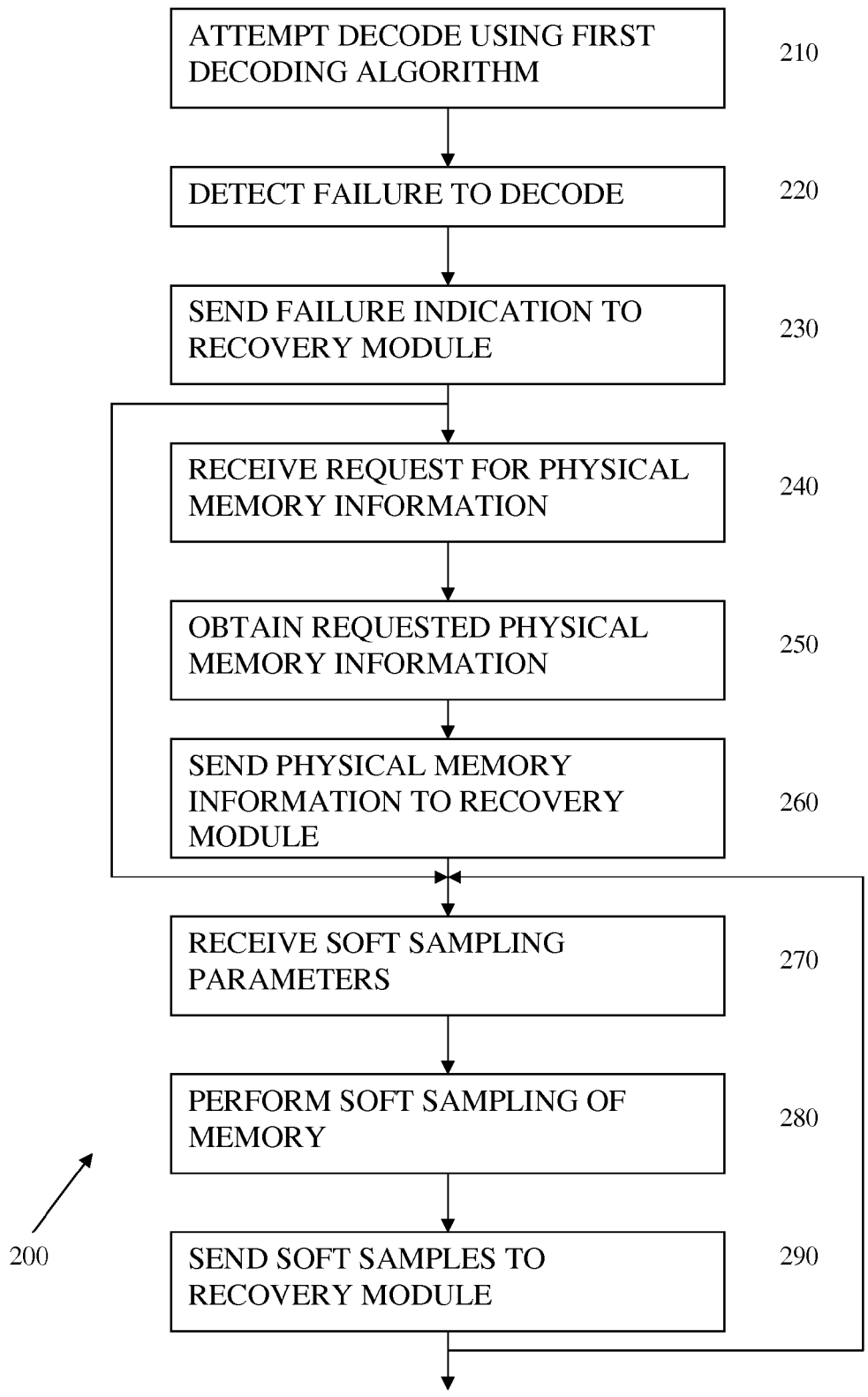
FIG. 2 is a flow diagram showing an example of a method performed by a storage device according to an embodiment of the invention.

FIG. 2 is a flow diagram showing an example of a method 200 performed by a storage device according to an embodiment of the invention.

At stage 210, storage device may attempt to decode encoded data stored in a memory, for example, by operating a memory controller employing a first decode algorithm, for example, a "hard" decoding algorithm. At stage 220, a failure of the first decoding algorithm may be detected, for example, by the memory controller, or by an application operating on a computer requesting data from the storage device.

At stage 230, a failure indication may be sent, for example, to a recovery module on a computer.

In some embodiments of the invention, after stage 230, the method may proceed to stage 240 or bypass stages 240-260 and proceed directly to stage 270. At stage 240, the storage device may receive a request, for example, from the recovery module, requesting certain physical information pertaining to the encoded data that could not be recovered. The encoded data physical information may include one or more of: (i) a cycle count of a memory block that stores the encoded data, (ii) coding parameters of the memory block that stores the encoded data, (iii) scrambling information of the encoded data, (iv) an identifier of the memory block that stores the encoded data, and (v) an existence of a older version of the encoded data in the storage device. At stage 250, the memory controller may obtain the requested physical information, and at stage 260, it may send the requested information to the recovery module.

At stage 270, the memory controller may receive parameters for performing soft sampling of the encoded data. If stages 240-260 were bypassed, the recovery module may determine the soft sampling parameters based on preset values. In other instances, the recovery module may use the physical information to determine the soft sampling parameters to be used by memory controller in performing the soft sampling.

The soft sampling parameters or instructions may include any of a variety of different parameters or instructions. For example, in some embodiments, the memory controller may be instructed to sample each bit of the encoded data multiple times to provide a set of samples and to process the set of samples to provide the soft samples of the encoded data. In some embodiments, the memory controller may be instructed to sample each bit of the encoded data multiple times to provide a set of samples and to return as a soft sample of the bit of the encoded data a median value of the set of samples. In some embodiments, the memory controller may be instructed to generate soft samples of the encoded data and to generate soft samples of at least one additional encoded data stored at the storage device. In some embodiments, the memory controller may be instructed to generate a first set of soft samples of the encoded data that is generated by performing a read process that involves providing a first bias voltage and to generate a second set of soft samples of the encoded data that is generated by performing a read process that involves providing a second bias voltage that differs from the first bias voltage.

At stage 280, the memory controller may perform soft sampling of the encoded data. If stages 230-270 were bypassed, the memory controller may use preset parameters to perform the soft sampling. In other embodiments, the memory controller may use the soft sampling parameters communicated to it by the recovery module at stage 270.

The soft sampling may be performed in any of a variety of different methods. In some embodiments of the invention, each bit of the encoded data may be sampled multiple times to provide a set of samples and to process the set of samples to provide the soft samples of the encoded data. In some embodiments, each bit of the encoded data may be sampled multiple times to provide a set of samples and to return as a soft sample of the bit of the encoded data a median value of the set of samples. Some embodiments of the invention may include generating soft samples of the encoded data and generating soft samples of at least one additional encoded data stored at the storage device. Some embodiments of the invention may include generating a first set of soft samples of the encoded data that is generated by performing a read process that involves providing a first bias voltage and generating a second set of soft samples of the encoded data that is generated by performing a read process that involves providing a second bias voltage that differs from the first bias voltage. The generating is not limited to two sets of soft samples that are generated by providing two different bias voltages and more that a pair of sets can be generated by providing more than a pair of bias voltages.

At stage 290, the soft samples may be sent to the recovery module for decoding using a second decoding algorithm. According to embodiments of the invention, and as described in connection with the method performed by the recovery module, if a second decoding algorithm performed by the recovery module was unsuccessful, the memory controller may be provided with additional or different soft sampling parameters or instructions, and accordingly, may repeat at least one of stages 270-290.

Figure 3:
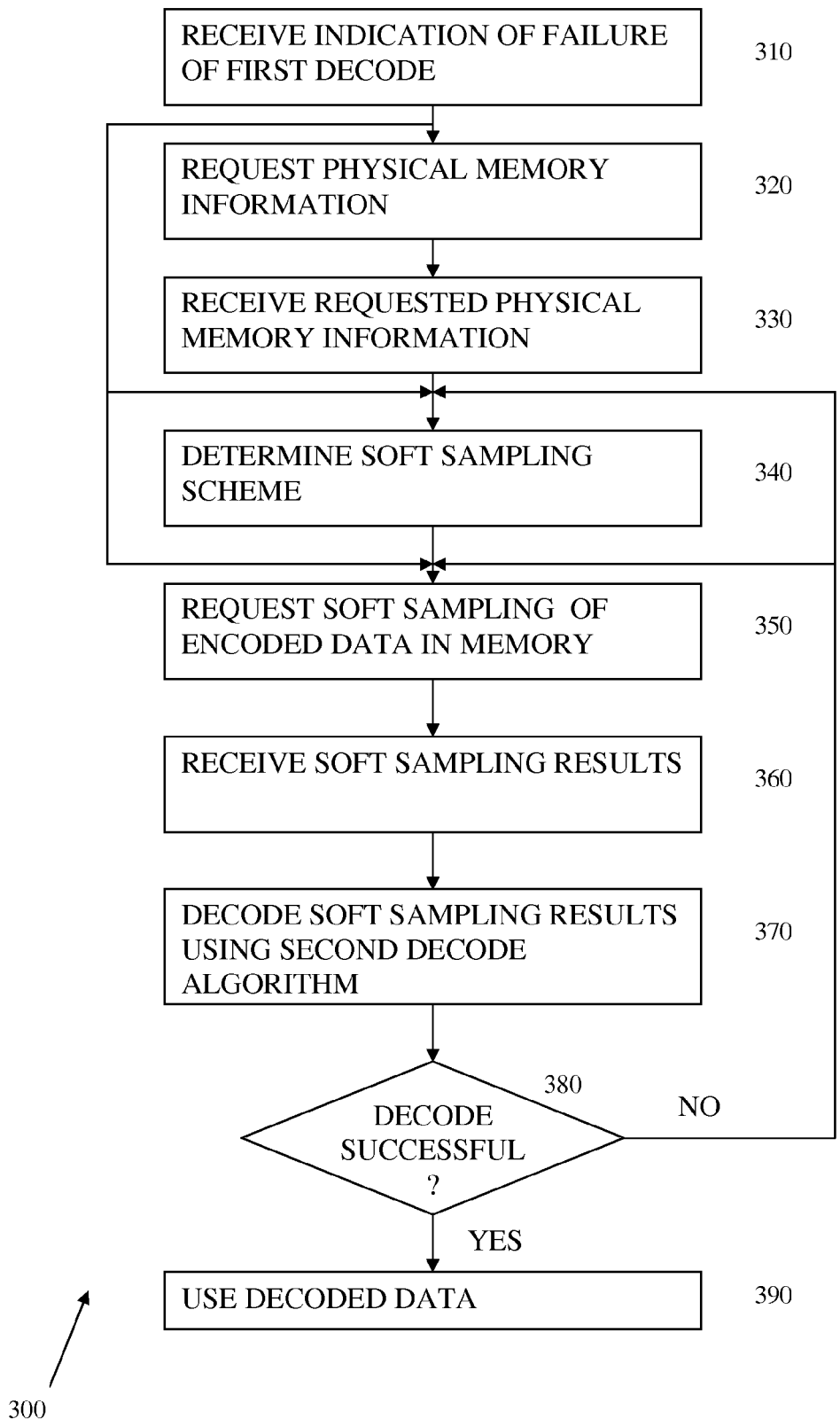
FIG. 3 is a flow diagram showing an example of a method performed by a recovery module according to an embodiment of the invention.

FIG. 3 is a flow diagram showing an example of a method 300 performed by a recovery module according to an embodiment of the invention.

At stage 310, the recovery module may receive an indication of failure of a first decoding algorithm (e.g., sent at stage 230). In some embodiments of the invention, the method may bypass stages 320-330 or 320-340 and proceed to stage 350 (described below). At stage 320, the recovery module may request certain physical information pertaining to the encoded data to be recovered. At stage 330, the requested information may be received. At stage 340, the recovery module may determine, for example, based on information obtained at stage 330, or based on preset defaults, the soft sampling recovery scheme to be performed, and the parameters required for the memory controller to perform the required sampling.

At stage 350, the recovery module may instruct the memory controller to perform soft sampling of the encoded data to provide soft samples of the encoded data. If stage 340 was performed, the instruction may include parameters obtained at stage 340.

At stage 360, the requested soft sampling data may be obtained from the memory controller.

At stage 370 the recovery module may apply a second ("soft") decoding algorithm on the soft samples of the encoded data provided, in order to provide restored data. The second decoding algorithm may have an error correction capability that exceeds an error correction capability of the first decoding algorithm. The second decoding algorithm can be a soft version of the first decoding algorithm. Soft sampling of data can reduce the error probability of a given code that uses the soft sampled data. Moreover, substantially all commonly used codes (e.g., RS/BCH codes, LDPC codes, Turbo codes, etc.) have feasible soft-decoding algorithms that use soft data sampling to reduce the error probability, as illustrated by: (i) R. Kotter and A. Vardy, "Algebraic soft decision decoding of Reed-Solomon codes," *IEEE Trans. Inform. Theory*, vol 49, No. 11, pp. 2809-2825, November 2003; (ii) M. Fossorier, M Mihaljevi'c, and H. Imai, "Reduced Complexity Iterative Decoding of Low-Density Parity Check Codes Based on Belief Propagation," *IEEE Trans. Comm.*, vol. 47, No. 5, pp. 673-680, May 1999; and (iii) C. Berrou, and A. Glavieux, "Near optimum error correcting coding and decoding: turbo codes," IEEE Trans. Comm vol. 44, No. 10, pp. 1261-1271, October 1996.

It will be understood that in some embodiments of the invention, the second decoding algorithm performed on the soft sampled data may be based on the encoded data physical information. For example, based on the additional physical information provided on a codeword that could not be "hard" decoded, the restoration algorithm can employ different strategies during its operation, e.g., (a) the amount of cycles the physical page experienced can suggest which programming parameters were used to program this page, what is the expected mean and STD (standard deviation) of each cell and other statistical parameters which are correlated to the cycling count of the block; (b) the coding parameters are needed when the correct decoding scheme is activated (some controllers can change the encoder's parameters based on bit type value, cycle count and other physical parameters); (c) the scrambling parameters are needed to produce the correct data. Usually, the data is scrambled just before the encoding phase. In order to produce the original data de-scrambling is done just after the decoding phase therefore the restoration process might need the scrambling parameters; and (d) the exact location of the pages within the block can suggest what were the drifts (shifts) in threshold values along the block were, which in turn can improve the estimation of the optimal thresholds needed to read the page. Moreover, using decoupling techniques one can read adjacent rows and use that information to reduce the coupling effect imposed on the erroneous page/s.

The second decoding algorithm may be applied based on the provided information. For example, reading and decoding other page data in the same physical row (e.g., different bit layers of the row) can help to identify programming errors (e.g., errors occurred when the upper bit layer is read erroneously as part of the programming process). In another example, older versions of the information can help to identify error bits.

At stage 380, the recovery module determines whether the second decoding algorithm successfully decoded the sampled data. If so, the method may proceed to stage 390. If not, the recovery module may determine that another attempt may be more successful, and may repeat some previous stages. For example, the recovery module may optionally repeat stage 340, determining a different soft sampling recovery scheme to be performed, and the parameters required for the memory controller to perform the required sampling. These may be requested and received at repeated stages 350 and 360, and another decoding process performed at stage 370. A number of repetitions of stages 340-370 or 350-370 may be repeated until success is achieved, or until a stop condition is reached, e.g., maximum number of tries, etc.

Finally, at stage 390, the data recovered by the second decoding algorithm may be used. For example, the data may be displayed, stored, transmitted, etc.

In some instances, after recovery of damaged data, use of the card may continue. For example, the memory controller may declare that the block where the first decoding algorithm failed is a bad block, and continue working with the card while refraining from using that block. In another instance, the recovery process may result in a recommendation to stop using the storage device altogether, for example, due to its excessively high bit-error-rate.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

What is claimed is:

1. A system for restoring damaged data programmed on a memory, the system comprising:
   a memory controller associated with a memory, the memory controller adapted to perform a first decoding algorithm having a first error correction capability on a portion of encoded data stored on the memory, wherein in the event of a failure of the first decoding algorithm to decode the portion of encoded data, the memory controller is adapted to send a failure notification; and
   a recovery module associated with a processor, said recovery module being adapted to receive the failure notification, send a request for soft sampling of the portion of encoded data stored on the memory,
   wherein the memory controller is further adapted to receive the request for soft sampling of the portion of encoded data stored on the memory, perform the soft sampling of the portion of encoded data accordingly, and send the results of the soft sampling to the recovery module, and
   wherein the recovery module is adapted to receive the results of the soft sampling and perform thereon a second decoding algorithm in response to at least one out of:
      (a) an existence of an older version of the memory block in which the portion of encoded data is stored in the memory;
      (b) scrambling information of the memory block in which the portion of encoded data is stored;
      (c) a threshold value shift along the memory block in which the portion of encoded data is stored; and
      (d) decoded bits stored at a first memory page of the memory, said first memory page being different from a second memory page in which the encoded data is stored, wherein the first and second memory pages comprise the same memory rows;
   wherein the second decoding algorithm has a second error correction capability, wherein the second error correction capability exceeds the first error correction capability.

2. The system according to claim 1, wherein the recovery module is adapted to perform thereon the second decoding algorithm in response to the existence of the older version of the memory block in which the portion of encoded data is stored in the memory.

3. The system according to claim 2, wherein the recovery module is further adapted to send to the memory controller a set of sampling instructions and wherein the set of sampling instructions include a number of times to sample each bit of the encoded data to thereby provide a set of samples and a request to return a median value of the samples of each bit of the portion of encoded data.

4. The system according to claim 2, wherein upon a failure of said second decoding algorithm to decode results of the soft sampling, said recovery unit is further adapted to repeat said steps of requesting and receiving soft sampling of the portion of encoded data stored on the memory based on a second set of sampling instructions, and perform the soft sampling of the results of the soft sampling obtained using the second set of sampling instructions.

5. The system according to claim 1, wherein the recovery module is further adapted to send to the memory controller a set of sampling instructions and to request and receive from the memory controller physical information pertaining to the memory, and to determine parameters of the second decoding algorithm based on the received physical information, wherein the set of sampling instructions are based at least in part on the determined second decoding algorithm.

6. The system according to claim 5, wherein the requested physical information includes at least one of: coding parameters of the memory block in which the portion of encoded data is stored, the scrambling information of the memory block in which the portion of encoded data is stored, an identifier of the memory block in which the portion of encoded data is stored, the existence of the older version of the memory block in which the portion of encoded data is stored in the memory.

7. The system according to claim 1, wherein the recovery module is adapted to perform the second decoding algorithm based on the threshold value shift along the memory block in which the portion of encoded data is stored.

8. The system according to claim 1, wherein the first decoding algorithm is a hard decoding algorithm, and wherein the second decoding algorithm is a soft version of the first decoding algorithm.

9. The system according to claim 1, wherein the first and second decoding algorithms are hard decoding algorithms.

10. The system according to claim 1, wherein the recovery module is adapted to: receive a first set of soft samples of the portion of the encoded data generated by performing a first read process providing a first bias voltage; receive a second set of soft samples of the portion of the encoded data generated by performing a second read process providing a second bias voltage, the second bias voltage being different from the first bias voltage; and apply the second decoding algorithm on the first and second sets of soft samples of the encoded data to provide the restored data.

11. The system according to claim 1, wherein the recovery module is adapted to perform the second decoding algorithm based on the scrambling information of the memory block in which the portion of encoded data is stored.

12. The system according to claim 1, wherein the recovery module is adapted to perform the second decoding algorithm based on the threshold value shift along the memory block in which the portion of encoded data is stored.

13. The system according to claim 1, wherein the recovery module is adapted to perform the second decoding algorithm based on decoded bits stored at a first memory page of the memory, said first memory page being different from a second memory page in which the encoded data is stored, wherein the first and second memory pages comprise the same memory rows.

14. A method for restoring damaged data programmed on a memory, the method comprising:
receiving an indication from a memory controller associated with a memory that a first decoding algorithm having a first error correction capability has failed to decode a portion of encoded data stored on the memory;
sending a request for soft sampling of the portion of encoded data stored on the memory;
receiving the results of the soft sampling from the memory controller; and
performing on the results of the soft sampling a second decoding algorithm in response to at least one out of:
(a) an existence of an older version of the memory block in which the portion of encoded data is stored in the memory;
(b) scrambling information of the memory block in which the portion of encoded data is stored;
(c) a threshold value shift along the memory block in which the portion of encoded data is stored; and
(d) decoded bits stored at a first memory page of the memory, said first memory page being different from a second memory page in which the encoded data is stored,
wherein the first and second memory pages comprise the same memory rows;
wherein the second decoding algorithm has a second error correction capability, wherein the second error correction capability exceeds the first error correction capability.

15. The method according to claim 14, comprising preforming the second decoding algorithm in response to the existence of the older version of the memory block in which the portion of encoded data is stored in the memory.

16. The method according to claim 15, further comprising: failing to decode the results of the soft sampling using the second decoding algorithm; requesting and receiving soft sampling of the portion of encoded data stored on the memory based on a second set of sampling instructions; and performing on the results of the soft sampling based on the second set of sampling instructions the second decoding algorithm.

17. The method according to claim 14, further comprising: sending to the memory controller a set of sampling instructions; requesting and receiving from the memory controller physical information pertaining to the memory; and determining parameters of the second decoding algorithm based on the received physical information, wherein the set of sampling instructions are based at least in part on the determined second decoding algorithm.

18. The method according to claim 17, wherein the requested physical information includes at least one of: coding parameters of the memory block in which the portion of encoded data is stored, the scrambling information of the memory block in which the portion of encoded data is stored, an identifier of the memory block in which the portion of encoded data is stored, the existence of the older version of the memory block in which the portion of encoded data is stored in the memory.

19. The method according to claim 14, comprising sending to the memory controller a set of sampling instructions; wherein the set of sampling instructions include a number of times to sample each bit of the encoded data to thereby provide a set of samples and a request to return a median value of the samples of each bit of the portion of encoded data.

20. The method according to claim 14, wherein performing the second decoding algorithm comprises performing the second decoding algorithm based on the threshold value shift along the memory block in which the portion of encoded data is stored.

21. The method according to claim 14, wherein the first decoding algorithm is a hard decoding algorithm, and wherein the second decoding algorithm is a soft version of the first decoding algorithm.

22. The method according to claim 14, wherein the first and second decoding algorithms are hard decoding algorithms.

23. The method according to claim 14, further comprising: receiving a first set of soft samples of the portion of the encoded data generated by performing a first read process providing a first bias voltage; receiving a second set of soft samples of the portion of the encoded data generated by performing a second read process providing a second bias voltage, the second bias voltage being different from the first bias voltage; and applying the second decoding algorithm on the first and second sets of soft samples of the encoded data to provide the restored data.

24. A computer-readable non-transient storage medium having stored thereon a set of instructions that when executed perform the following:

receive an indication from a memory controller associated with a memory that a first decoding algorithm having a first error correction capability has failed to decode a portion of encoded data stored on the memory;

send a request for soft sampling of the portion of encoded data stored on the memory;

receive the results of the soft sampling from the memory controller;

perform on the results of the soft sampling a second decoding algorithm in response to at least one out of:
  (a) an existence of an older version of the memory block in which the portion of encoded data is stored in the memory;
  (b) scrambling information of the memory block in which the portion of encoded data is stored;
  (c) a threshold value shift along the memory block in which the portion of encoded data is stored; and
  (d) decoded bits stored at a first memory page of the memory, said first memory page being different from a second memory page in which the encoded data is stored, wherein the first and second memory pages comprise the same memory rows;

wherein the second decoding algorithm has a second error correction capability, wherein the second error correction capability exceeds the first error correction capability.

* * * * *